(12) United States Patent
Takahashi

(10) Patent No.: US 6,725,286 B2
(45) Date of Patent: Apr. 20, 2004

(54) INFORMATION-PROCESSING APPARATUS, INFORMATION-PROCESSING METHOD, MEMORY CARD AND PROGRAM STORAGE MEDIUM

(75) Inventor: Naomasa Takahashi, Chiba (JP)

(73) Assignee: Sony Corporation, Tokyo (JP)

( * ) Notice: Subject to any disclaimer, the term of this patent is extended or adjusted under 35 U.S.C. 154(b) by 243 days.

(21) Appl. No.: 09/942,511

(22) Filed: Aug. 29, 2001

(65) Prior Publication Data

US 2002/0049887 A1 Apr. 25, 2002

(30) Foreign Application Priority Data

Aug. 31, 2000 (JP) ........................................ 2000-262062

(51) Int. Cl.[7] .............................................. G06F 13/12
(52) U.S. Cl. ................................ 710/8; 710/11; 710/62; 710/72
(58) Field of Search ................................ 710/8, 11, 72, 710/62

(56) References Cited

U.S. PATENT DOCUMENTS

| | | | | |
|---|---|---|---|---|
| 5,787,299 A | * | 7/1998 | Ostler et al. ................. | 395/800 |
| 5,920,731 A | * | 7/1999 | Pletl et al. .................... | 395/834 |
| 6,108,730 A | * | 8/2000 | Dell et al. .................... | 710/102 |
| 6,138,180 A | * | 10/2000 | Zegelin ........................ | 710/11 |
| 6,237,048 B1 | * | 5/2001 | Allen et al. ................... | 710/8 |
| 6,385,667 B1 | * | 5/2002 | Estakhri et al. ............... | 710/8 |

FOREIGN PATENT DOCUMENTS

| JP | 408306195 A | * 11/1996 | ........... G11C/16/06 |
|---|---|---|---|

* cited by examiner

*Primary Examiner*—Abdelmoniem Elamin
(74) *Attorney, Agent, or Firm*—Frommer Lawrence & Haug LLP; William S. Frommer

(57) ABSTRACT

The invention relates to an information-processing apparatus, an information-processing method, a memory card and a program storage medium. A memory card has VSS pins connected to the ground, a BS (Bus State) pin for receiving a bus-state signal, VCC pins for receiving a voltage of a power supply, an interrupt pin for outputting interrupt data, a clock pin for receiving a clock signal and reserved pins conforming to a USB standards. When the memory card is inserted into a personal computer, the reserved pins are connected to a USB-host-controller IC employed in the personal computer so that serial data conforming to the USB standards can be exchanged between the memory card and the personal computer. With this configuration, a desired function can be added to the memory card.

9 Claims, 14 Drawing Sheets

FIG. 14

| PIN | 16-BIT MODE SIGNAL | 32-BIT CARD-BUS MODE SIGNAL | PIN | 16-BIT MODE SIGNAL | 32-BIT CARD-BUS MODE SIGNAL |
|---|---|---|---|---|---|
| 1 | GND | GND | 35 | GND | GND |
| 2 | D3 | CAD0 | 36 | CD1# | CCD1# |
| 3 | D4 | CAD1 | 37 | D11 | CAD2 |
| 4 | D5 | CAD3 | 38 | D12 | CAD4 |
| 5 | D6 | CAD5 | 39 | D13 | CAD6 |
| 6 | D7 | CAD7 | 40 | D14 | RFU ※1 |
| 7 | CE1# | CCBE0# | 41 | D15 | CAD8 |
| 8 | A10 | CAD9 | 42 | CE2# | CAD10 |
| 9 | OE# | CAD11 | 43 | VS1# | CVS1 |
| 10 | A11 | CAD12 | 44 | RFU | CAD13 |
| 11 | A9 | CAD14 | 45 | RFU | CAD15 |
| 12 | A8 | CCBE1# | 46 | A17 | CAD16 |
| 13 | A13 | CPAR | 47 | A18 | RFU ※1 |
| 14 | A14 | CPERR# | 48 | A19 | CBLOCK# |
| 15 | WE# | CGNT# | 49 | A20 | CSTOP# |
| 16 | READY | CINT# | 50 | A21 | CDEVSEL# |
| 17 | $V_{CC}$ | $V_{CC}$ | 51 | $V_{CC}$ | $V_{CC}$ |
| 18 | $V_{PP2}$ | $V_{PP1}$ | 52 | $V_{PP2}$ | $V_{PP2}$ |
| 19 | A16 | CCLK | 53 | A22 | CTRDY# |
| 20 | A15 | CIRDY# | 54 | A23 | CFRAME# |
| 21 | A12 | CCBE2# | 55 | A24 | CAD17 |
| 22 | A7 | CAD18 | 56 | A25 | CAD19 |
| 23 | A6 | CAD20 | 57 | VS2# | CVS2 |
| 24 | A5 | CAD21 | 58 | RESET | CRST# |
| 25 | A4 | CAD22 | 59 | WAIT# | CSERR# |
| 26 | A3 | CAD23 | 60 | RFU | CREQ# |
| 27 | A2 | CAD24 | 61 | REG# | CCBE3# |
| 28 | A1 | CAD25 | 62 | BVD2 | CAUDIO |
| 29 | A0 | CAD26 | 63 | BVD1 | CSTSCHG |
| 30 | D0 | CAD27 | 64 | D8 | CAD28 |
| 31 | D1 | CAD29 | 65 | D9 | CAD30 |
| 32 | D2 | RFU ※1 | 66 | D10 | CAD31 |
| 33 | WP | CCLKRUN# | 67 | CD2# | CCD2# |
| 34 | GND | GND | 68 | GND | GND |

INFORMATION-PROCESSING APPARATUS, INFORMATION-PROCESSING METHOD, MEMORY CARD AND PROGRAM STORAGE MEDIUM

BACKGROUND OF THE INVENTION

In general, the present invention relates to an information-processing apparatus, an information-processing method, a memory card and a program storage medium. More particularly, the present invention relates to an information-processing apparatus allowing a desired function to be added to a memory card by using existing USB standards, an information-processing method adopted in the information-processing apparatus, the memory card and a program storage medium for storing the information-processing method.

In recent years, among memory cards each based on a flash memory, there has been proposed a compound-type memory card mounted on a device having functions such as Bluetooth (a trademark) conforming to contemporary radio communication specifications, a camera function and a GPS (Global Positioning System) function. This compound-type memory card is provided with extensibility for an information home appliance field's products such as a PDA (Personal Digital Assistant) and a DTV (Digital television).

By the way, providing an existing memory card with another function raises a problem that, if a peculiar interface is determined independently, it inevitably takes time to set the peculiar interface's specifications themselves.

In addition, since it is necessary to provide an IC such as a controller for controlling the peculiar interface, there is also raised a problem of a hindrance to speedy introduction of the memory card to the market in spite of the fact that such speedy introduction is necessary for today's information home appliances.

Thus, also on the device-manufacturer side, it unavoidably takes time to understand the specifications of a peculiar interface. In addition, it also inevitably takes time to solve a problem caused by data incompatibility on the host-unit side and the device side.

SUMMARY OF THE INVENTION

It is thus an object of the present invention addressing the problems described above to provide an information-processing apparatus and an information-processing method that allow a desired function to be added to a memory card by using the existing USB standards and are capable of downloading a device driver stored in the memory card.

In order to attain the object described above, according to a first aspect of the present invention, there is provided an information-processing apparatus exchanging first or second data with a memory card mounted on the information-processing apparatus, the apparatus comprising: first communication means for exchanging the first data with a first pin employed in the memory card; and second communication means for exchanging the second data with a second pin employed in the memory card.

According to a second aspect of the present invention, there is provided an information-processing method adopted in an information-processing apparatus exchanging first or second data with a memory card mounted on the information-processing apparatus, the information-processing method comprising: a first communication step of exchanging the first data with a first pin employed in the memory card; and a second communication step of exchanging the second data with a second pin employed in the memory card.

According to a third aspect of the present invention, there is provided a program storage medium for storing a computer-readable program executable by a computer for controlling an information-processing apparatus exchanging first or second data with a memory card mounted on the information-processing apparatus, the program comprising: a first communication step of exchanging the first data with a first pin employed in the memory card; and a second communication step of exchanging the second data with a second pin employed in the memory card.

With these configurations, first data is exchanged through a first pin of a memory card whereas second data is exchanged through a second pin of the memory card. As a result, a device driver can be downloaded with ease from the memory card.

According to a fourth aspect of the present invention, there is provided a memory card connected to an information-processing apparatus, the memory card comprising: connection means connected to the information-processing apparatus by a plurality of first and second pins; first communication means for exchanging first data with the information-processing apparatus through the first pin employed in the connection means; and second communication means for exchanging second data with the information-processing apparatus through the second pin employed in the connection means.

With this configuration, the memory card is connected to an information-processing apparatus by a plurality of first and second pins, wherein first data is exchanged through the first pin of the memory card whereas second data is exchanged through the second pin of the memory card. As a result, a desired function can be added to the memory card with ease.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 14 is a diagram showing typical assignment of pins employed in a memory card implemented by a third embodiment of the present invention.

PREFERRED EMBODIMENTS OF THE INVENTION

Figure 1:
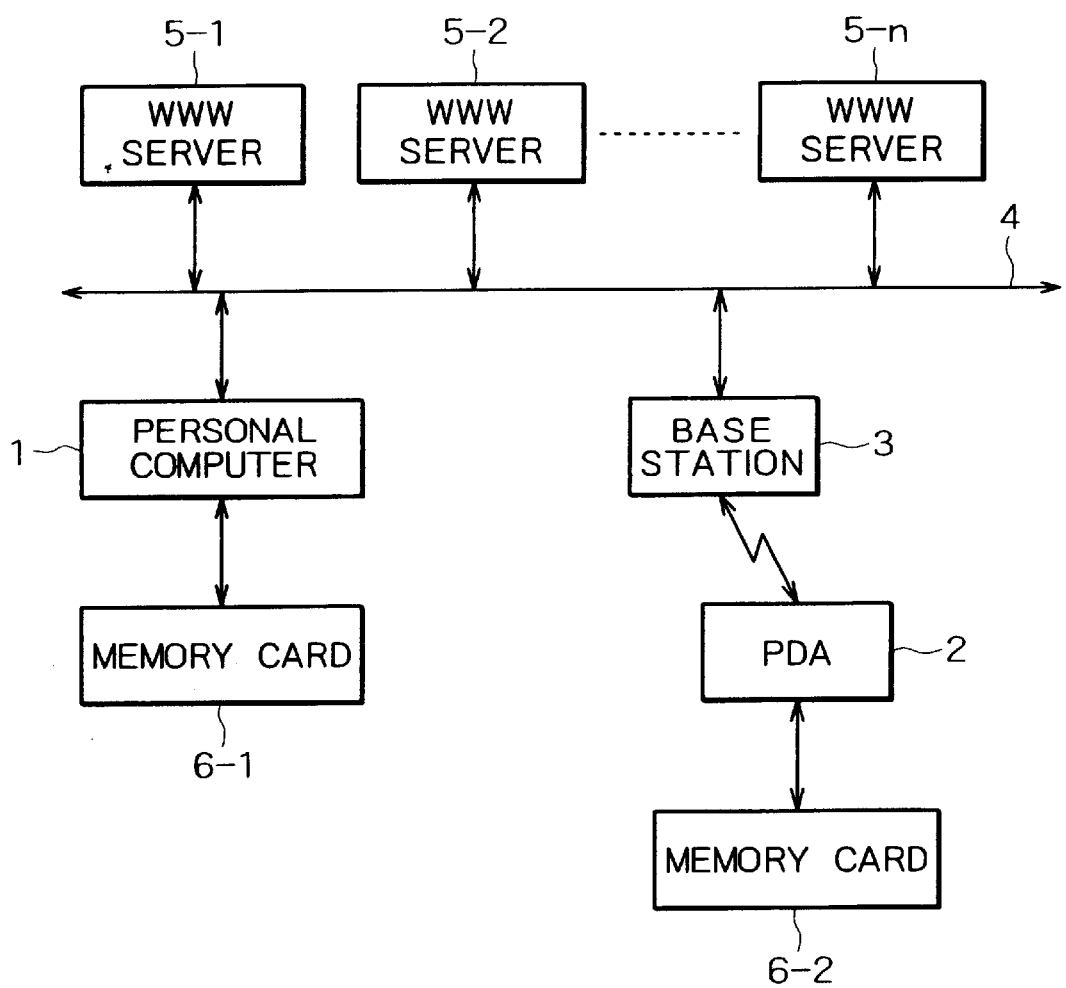
FIG. 1 is a diagram showing a typical configuration of an embodiment implementing a network system provided by the present invention.

FIG. 1 is a block diagram showing a typical configuration of an embodiment implementing a network system provided by the present invention. As shown in the FIGURE, this network system comprises a personal computer 1, a base station 3 and WWW servers 5-1 to 5-n, which are connected to each other by a network 4 such as a public line network. Furthermore, a PDA 2 is connected to the base station 3 through radio communication.

The base station 3 is connected to the PDA 2 through radio communication forming a code division multiple connection called a W-CDMA (Wideband-Code Division Multiple Access). The base station 3 is thus capable of communicating a large amount of data with the PDA 2 serving as a mobile radio station by using a 2-GHz frequency band at a data transmission speed of up to a maximum of 2 Mbps.

The personal computer 1 is also capable of communicating a large amount of data at a high speed through the network 4. A memory card 6-1 can be inserted into the personal computer 1.

The PDA 2 is also capable of communicating a large amount of data at a high speed through the base station 3 and the network 4. A memory card 6-2 can be inserted into the PDA 2.

Accesses can be made from the personal computer 1 and the PDA 2 to the WWW servers 5-1 to 5-n in accordance with a protocol known as a TCP/IP (Transmission Control Protocol/Internet Protocol). In the following description, if it is not necessary to distinguish the WWW servers 5-1 to 5-n from each other, the WWW servers 5-1 to 5-n are denoted by generic reference numeral 5.

Figure 2:
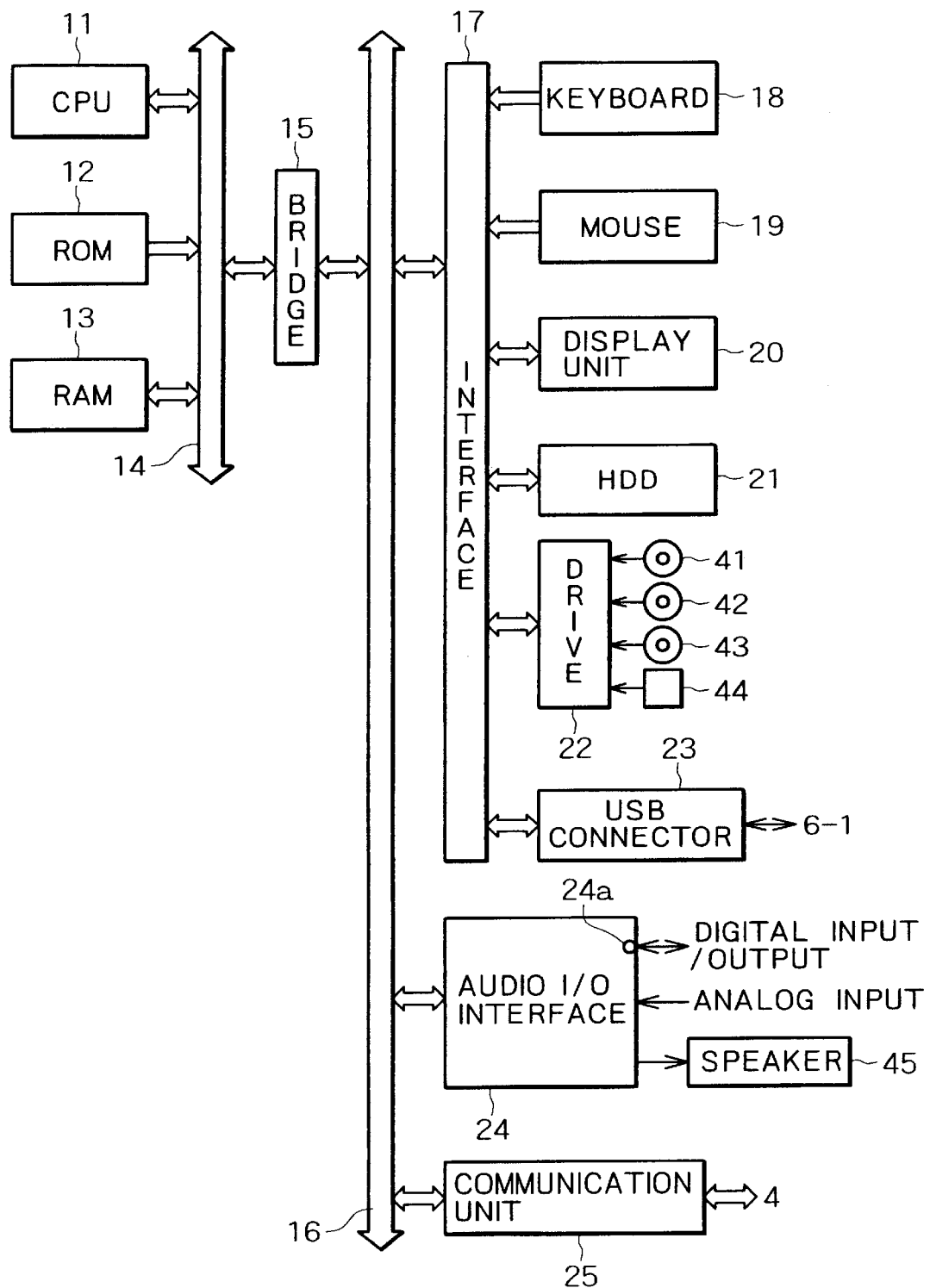
FIG. 2 is an explanatory diagram showing a typical internal configuration of a personal computer employed in the network system shown in FIG. 1.

FIG. 2 is an explanatory block diagram showing a typical internal configuration of the personal computer 1. As shown in the FIGURE, the personal computer 1 includes a CPU (Central Processing Unit) 11 for actually executing a variety of application programs and an OS (Operating System). In general, a ROM (Read-Only Memory) 12 is used for storing the programs to be executed by the CPU 11 and basically fixed data used as parameters in processing carried out by the CPU 11. On the other hand, a RAM (Random-Access Memory) 13 is used for storing one of the programs, which is being executed by the CPU 11, and parameters changing from time to time in the course of program execution. The CPU 11, the ROM 12 and the RAM 13 are connected to each other by a host bus 14 implemented by typically a CPU bus.

The host bus 14 is connected to an external bus 16 such as a PCI (Peripheral Component Interconnect/Interface) bus by a bridge 15.

A keyboard 18 is operated by the user to enter a variety of commands to the CPU 11. A mouse 19 is operated by the user to point to and/or select an item on a screen of a display unit 20. Implemented by typically a liquid-crystal display device or a CRT (Cathode Ray Tube), the display unit 20 is used for displaying various kinds of information as a text and/or an image. An HDD (Hard-Disc Drive) 21 drives a hard disc and is used for storing programs to be executed by the CPU 11 and information. The HDD 21 allows any of the programs and the information to be recorded and played back therefrom.

A drive 22 reads out data or a program from a magnetic disc 41, an optical disc 42 (including a CD), a magneto-optical disc 43 or a semiconductor memory 44. The magnetic disc 41, the optical disc 42, the magneto-optical disc 43 or the semiconductor memory 44 is mounted on the drive 22. The program or the data is supplied to the RAM 13 connected to the host bus 14 by way of an interface unit 17, the external bus 16, the bridge 15 and the host bus 14.

USB (Universal Serial Bus) connector 23 is connected to the memory card 6-1. The USB connector 23 outputs data supplied by the HDD 21 by way of the interface unit 17 to the memory card 6-1. The USB connector 23 also outputs data supplied by the CPU 11 or the RAM 13 by way of the host bus 14, the bridge 15, the external bus 16 and the interface unit 17 to the memory card 6-1. The data supplied to the memory card 6-1 includes a command given to the memory card 6-1.

An audio input/output interface unit 24 including an IEC (International Electrotechnical Commission)-60958 pin 24a carries out interface processing for digital audio inputs and outputs or analog audio inputs and outputs. A speaker 45 outputs sounds representing a content on the basis of an audio signal received from the audio input/output interface unit 24.

The peripheral components ranging from the keyboard 18 to the audio input/output interface unit 24 are connected to the interface unit 17 and to the CPU 11 by the interface unit 17, the external bus 16, the bridge 15 and the host bus 14.

A communication unit 25 is connected to the network 4. The communication unit 25 includes data received from the CPU 11 or the HDD 21 in a packet conforming to a predetermined communication system and outputs the packet to the network 4. The data may be a request for a transmission of information. The communication unit 25 also receives a packet from the network 4 and passes on data included in the received packet to the CPU 11, the RAM 13 or the HDD 21.

The communication unit 25 is connected to the CPU 11 by the external bus 16, the bridge 15 and the host bus 14.

Figure 3:
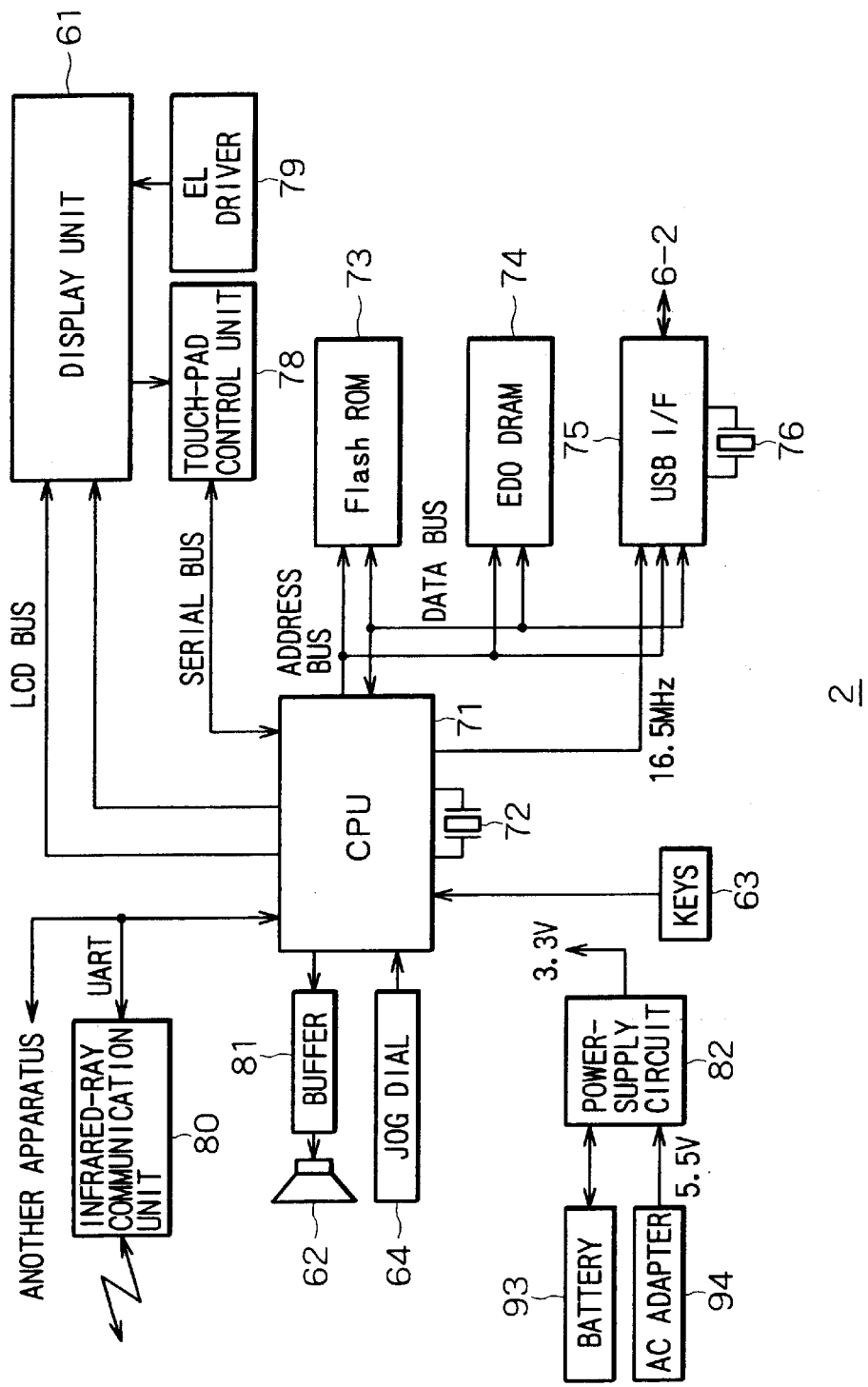
FIG. 3 is an explanatory diagram showing a typical internal configuration of a PDA employed in the network system shown in FIG. 1.

FIG. 3 is an explanatory diagram showing a typical internal configuration of the PDA 2. A CPU 71 shown in the FIGURE executes a variety of programs stored in a flash ROM 73 or an EDO DRAM (Extended Data Out Dynamic RAM) 74 synchronously with a clock signal generated by an oscillator 72.

The flash ROM 73 is a kind of EEPROM (Electrically Erasable Programmable ROM) and implemented as a flash memory. In general, the flash ROM 73 is used for storing programs executed by the CPU 71 and basically fixed data serving as parameters for processing. On the other hand, the EDO DRAM 74 is used for storing one of the programs, which is being executed by the CPU 71, and parameters varying from time to time during the execution of the program.

In synchronization with a clock signal supplied by an oscillator 76, a USB interface unit 75 reads out data or a program from the memory card 6-2 mounted on the PDA 2, and writes data supplied by the CPU 71 into the memory card 6-2.

The flash ROM 73, the EDO DRAM 74 and a USB interface unit 75 are connected to the CPU 71 by an address bus and a data bus.

A display unit 61 receives data supplied by the CPU 71 through an LCD (Liquid Crystal Display) bus, and displays the received data as typically pictures and/or characters. When a touch pad provided on the upper side of a display unit 61 is operated, a touch-pad control unit 78 receives data representing the operation carried out on the touch pad, data representing a touched coordinate for example, from the display unit 61, and supplies a signal representing the received data to the CPU 71 by way of a serial bus.

An EL (Electroluminescence) driver 79 drives an EL element provided on the rear side of a liquid-crystal display device employed in the display unit 61 to control the brightness of the display of the display unit 61.

An infrared-ray communication unit 80 transmits data received from the CPU 71 by way of a UART (Universal Synchronous Receiver-Transmitter) to another apparatus not shown in the FIGURE as an infrared ray serving as communication media. The infrared-ray communication unit 80 also receives an infrared ray used as communication media to represent data output by the other apparatus and supplies the data to the CPU 71. In addition, the PDA 2 is also capable of communicating with other apparatuses through the UART.

An audio playback unit 62 plays back audio data received from the CPU 71 through a buffer 81 and outputs a sound representing the audio data. Keys 63 comprising input keys are operated by the user to enter a variety of commands to the CPU 71. A jog dial 64 supplies data representing a rotary scanning or a scanning applying a pressure against the main body of the PDA 2 to the CPU 71.

A power-supply circuit 82 converts a power-supply voltage received from a battery 93 mounted on the PDA 2 or an AC (Alternating Current) adapter 94 connected to the PDA 2, and supplies a power obtained as a result of the conversion to the CPU 71 and the buffer 81.

Figure 4:
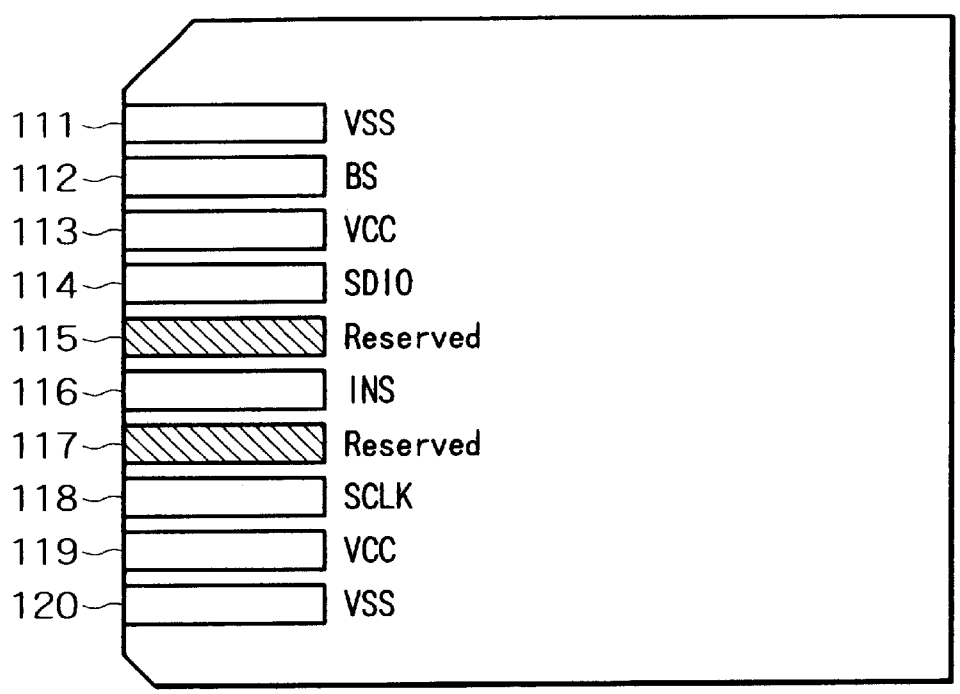
FIG. 4 is a diagram showing a typical layout of pins of a memory card provided by a first embodiment of the present invention.

FIG. 4 is a diagram showing a typical layout of pins of the memory card 6 provided by a first embodiment of the present invention.

The memory card 6 shown in the FIGURE represents typically a flash-memory card which is called a Memory Stick (a trademark) and developed by Sony Corporation, the applicant for a patent of the present invention. The Memory Stick is a flash-memory device accommodated in a small and thin plastic case with a height of 21.5 mm, a width of 50 mm and a thickness of 2.8 mm. The flash-memory device is a kind of EEPROM (Electrically Erasable Programmable Read-Only Memory) which is a non-volatile memory. The Memory Stick allows various kinds of data such as pictures and sounds to be read out therefrom and written therein through 10 pins.

In addition, the Memory Stick adopts an original serial protocol capable of maintaining compatibility with an apparatus using the Memory Stick even if specifications of the embedded flash memory are changed due to enhancement of the storage capacity or the like. The Memory Sticks exhibits high performance such as a maximum write speed of 1.5 MB/S and a maximum read speed of 2.45 MB/S as well as assures high reliability by using an inadvertent-erasure prevention switch.

In the case of the embodiment shown in FIG. 4, the memory card 6 has a total of 10 pins, namely, pins 111 to 120. To be more specific, the 10 pins are VSS pins 111 and 120 connected to the ground, a BS (Bus State) pin 112 for receiving a bus-state signal, VCC pins 113 and 119 for receiving a voltage of a power supply, an SDIO (Serial Data In/Out) pin 114 for outputting serial data, an INS (INterrupted Status) pin 116 for outputting interrupted data, a clock pin 118 for receiving a clock signal and reserved pins 115 and 117. Allocated to a differential data unit of an interface of a serial system conforming to typically the USB standards, the reserved pins 115 and 117 are a characteristic of the present invention.

Figure 5:
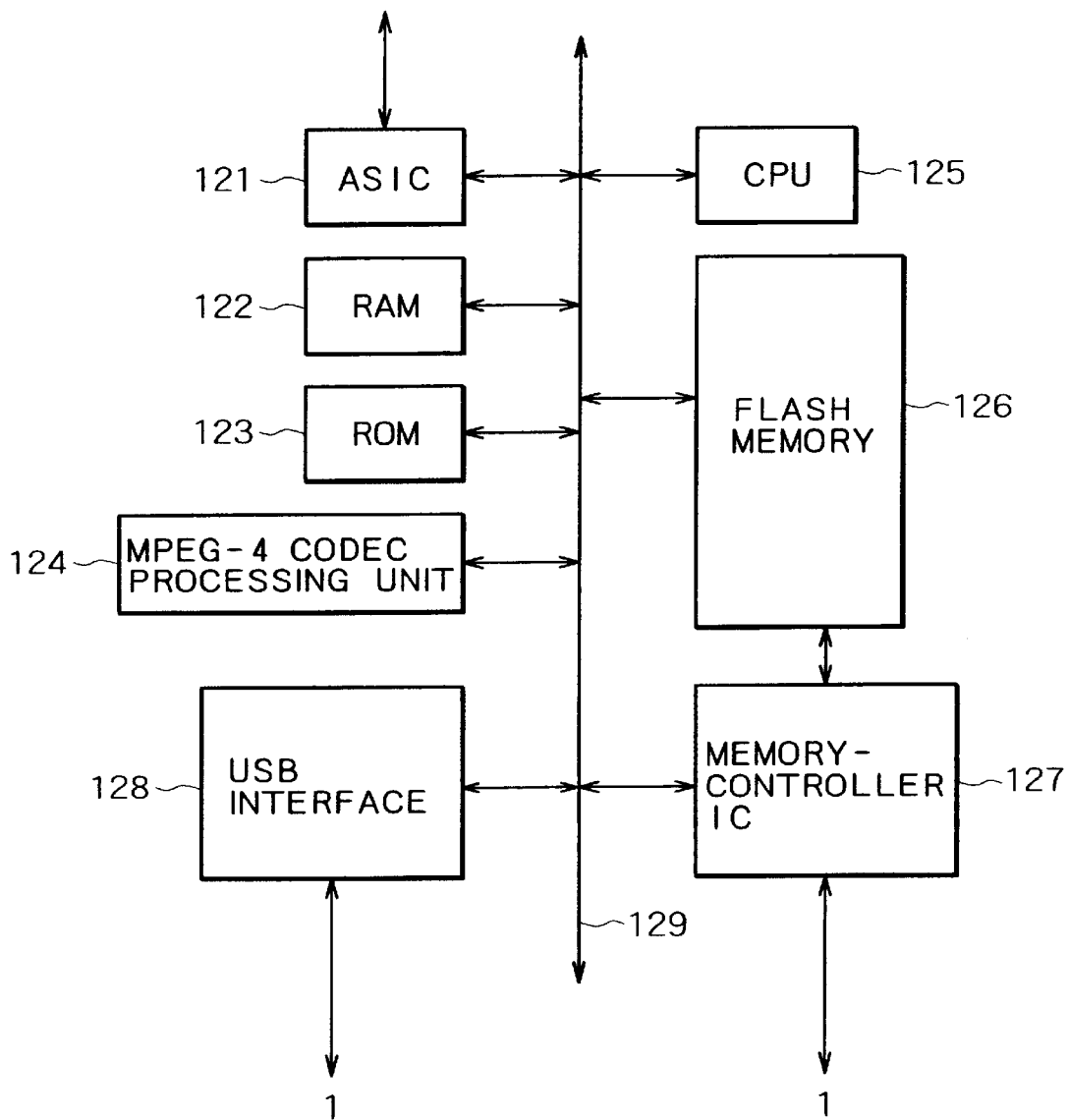
FIG. 5 is a block diagram showing a typical configuration of hardware of memory card shown in FIG. 4.

FIG. 5 is a block diagram showing a typical configuration of hardware of the memory card 6 shown in FIG. 4.

An ASIC (Application Specific Integrated Circuit) 121 shown in FIG. 5 is connected to typically a camera unit not shown in the FIGURE. Picture data received from the camera unit is supplied to the personal computer 1 by way of a bus 129 and a memory-controller IC 127 or a USB interface unit 128. In addition, the ASIC 121 also executes a specific application program and a specific OS (Operating System).

In general, a RAM (Random-Access Memory) 122 is used for storing the programs to be executed by the ASIC 121 and basically fixed data used as parameters in processing carried out by the ASIC 121. On the other hand, a ROM (Read-Only Memory) 123 is used for storing one of the programs, which is being executed by the ASIC 121, and parameters changing from time to time in the course of program execution.

An MPEG-4 (Moving Picture Experts Group-4) Codec processing unit 124 encodes picture data received from the camera unit by using Codec or the like to convert the data into data with a communication-oriented format.

A CPU 125 actually executes a variety of ordinary application programs and an OS. In general, a flash memory 126 is used for storing the programs to be executed by the CPU 125 and basically fixed data used as parameters in processing carried out by the CPU 125.

Controlled by the CPU 125, the memory-controller IC 127 supplies picture data received from the camera unit through the bus 129 to the personal computer 1, and supplies a data command or the like received from the personal computer 1 to the camera unit by way of the bus 129.

By the same token, controlled by the CPU 125, the USB interface unit 128 supplies picture data received from the camera unit through the bus 129 to the personal computer 1 conforming to the USB standards, and supplies a data command or the like received from the personal computer 1 conforming to the USB standards to the camera unit by way of the bus 129.

Figure 6:
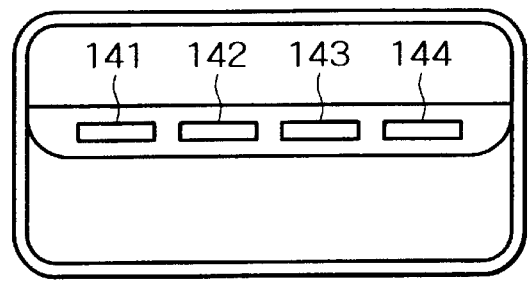
FIG. 6 is an explanatory diagram showing assignment of pins of a series-A USB connector.

Assignment of pins of a series-A USB connector is explained by referring to FIG. 6. As shown in the FIGURE, the series-A USB connector has 4 pins. A pin 141 receives a power from a power supply Vcc. A pin 142 receives negative communication data (DATA−) while a pin 143 receives positive communication data (DATA+). A pin 144 is connected to the GND (ground).

By using the pins of the USB connector described above, the hardware design of the personal computer 1 becomes easy.

Figure 7:
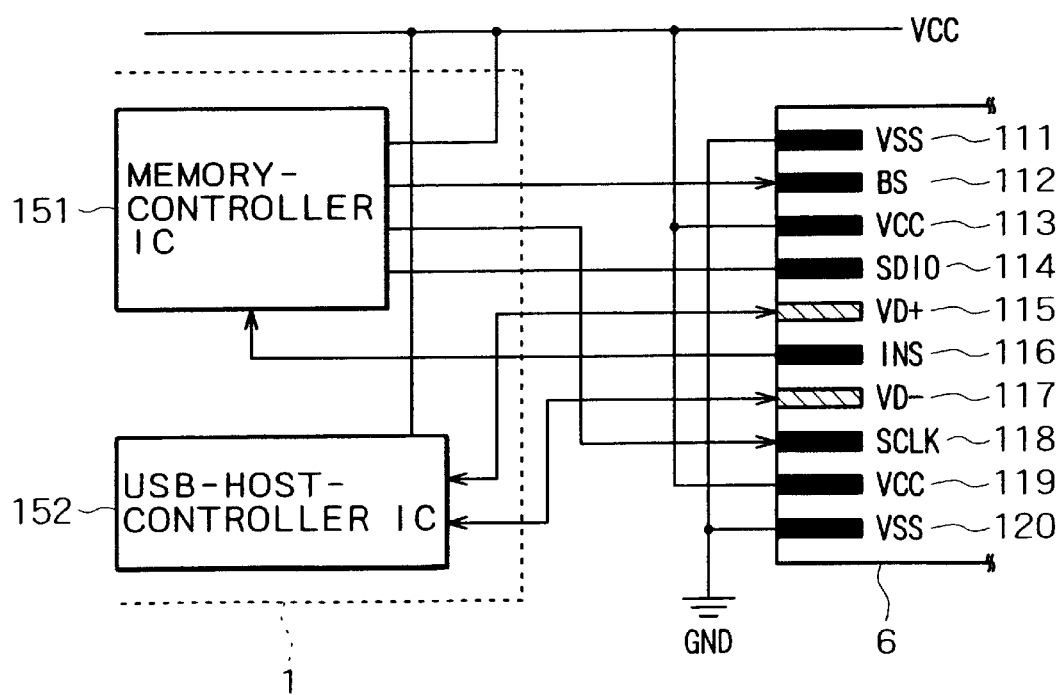
FIG. 7 is a diagram showing a typical internal configuration of the memory card shown in FIG. 4 with the memory card connected to the personal computer.

FIG. 7 is a diagram showing a typical internal configuration of the memory card 6 shown in FIG. 4 with the memory card 6 connected to the personal computer 1.

As shown in the FIGURE, the pins 112, 114, 116 and 118 of the memory card 6 are connected to a memory-controller IC 151 of the personal computer 1 and used for exchanging data between the personal computer 1 and the memory card 6. On the other hand, the pins 115 and 117 of the memory card 6 are connected to a USB-host-controller IC 152 of the personal computer 1 and used for exchanging serial data conforming to the USB standards between the personal computer 1 and the memory card 6.

Since even version 1.1 of the USB standards for example specifies a maximum transfer speed of 12 Mbps, a transfer capacity is provided for an apparatus having the Bluetooth or GPS function, a digital camera or the like. In addition, in the case of a moving picture, a required function can be executed sufficiently by using a compression technology such as the MPEG standards.

Figure 8:
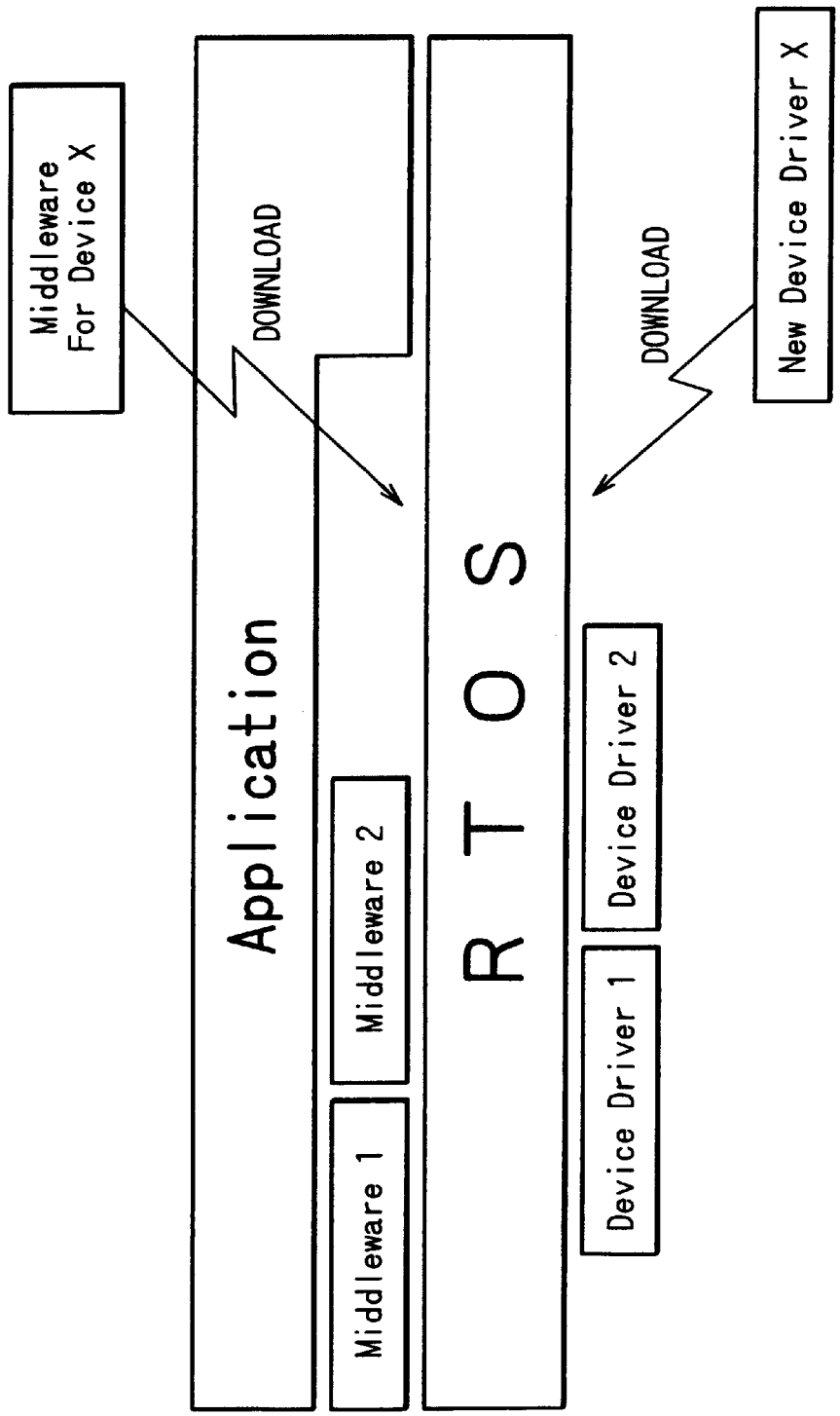
FIG. 8 is a diagram showing a typical software stack stored in a ROM employed in the memory card.

FIG. 8 is a diagram showing a typical software stack stored in the ROM 123 employed in the memory card 6 shown in FIG. 5. Modules shown on the upper side in the FIGURE are placed at a layer higher than modules shown on the lower side.

Device drivers 1 and 2 are each a module described as a portion dependent on the USB standards. They are software providing upper-layer software with a common procedure for making an access.

A real-time OS (RTOS) is software for downloading a new device-driver object.

Middlewares 1 and 2 are positioned between lower-level software such as the RTOS and upper-level application software. Middlewares 1 and 2 render a variety of services to an application.

The application is software for downloading a new middleware object.

Figure 9:
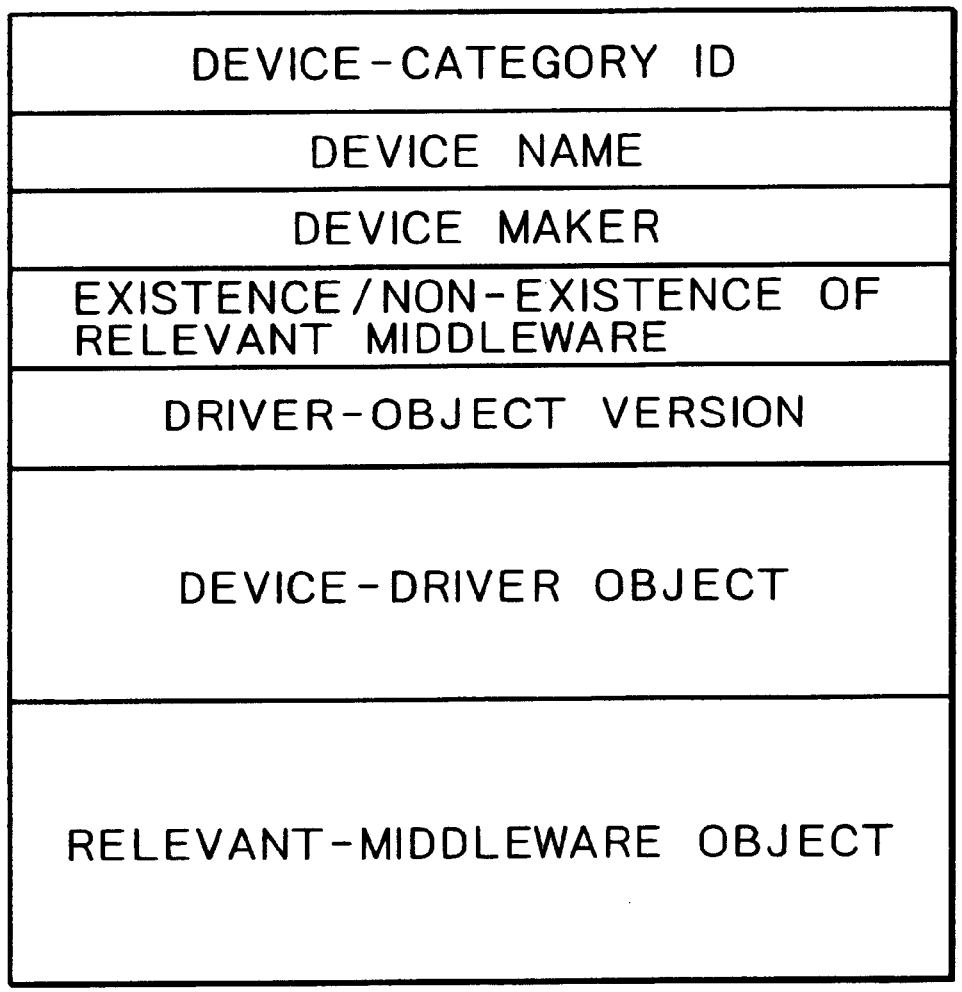
FIG. 9 is a diagram showing a data block of a device driver.

It should be noted that, as shown in FIG. 9, each device driver itself is stored in the ROM 123 employed by the memory card 6 as a block.

The block of the device driver shown in FIG. 9 comprises a device-category ID, a device name, a device maker, information indicating existence/non-existence of a relevant middleware, the version of the driver object, a device-driver object, and a relevant middleware object.

With device drivers stored in the ROM 123 employed in the memory card 6 as described above, typically, insertion of the memory card 6 into the personal computer 1 triggers an operation to download the object of a device driver into the personal computer 1.

To be more specific, software in the personal computer 1 detects what device has been inserted into the personal computer 1 and downloads a device driver for the already inserted device from the memory card 6. In this way, a device driver not required in the course of execution of an application program in the personal computer 1 is not downloaded to avoid wasteful use of the memory.

Figure 10:
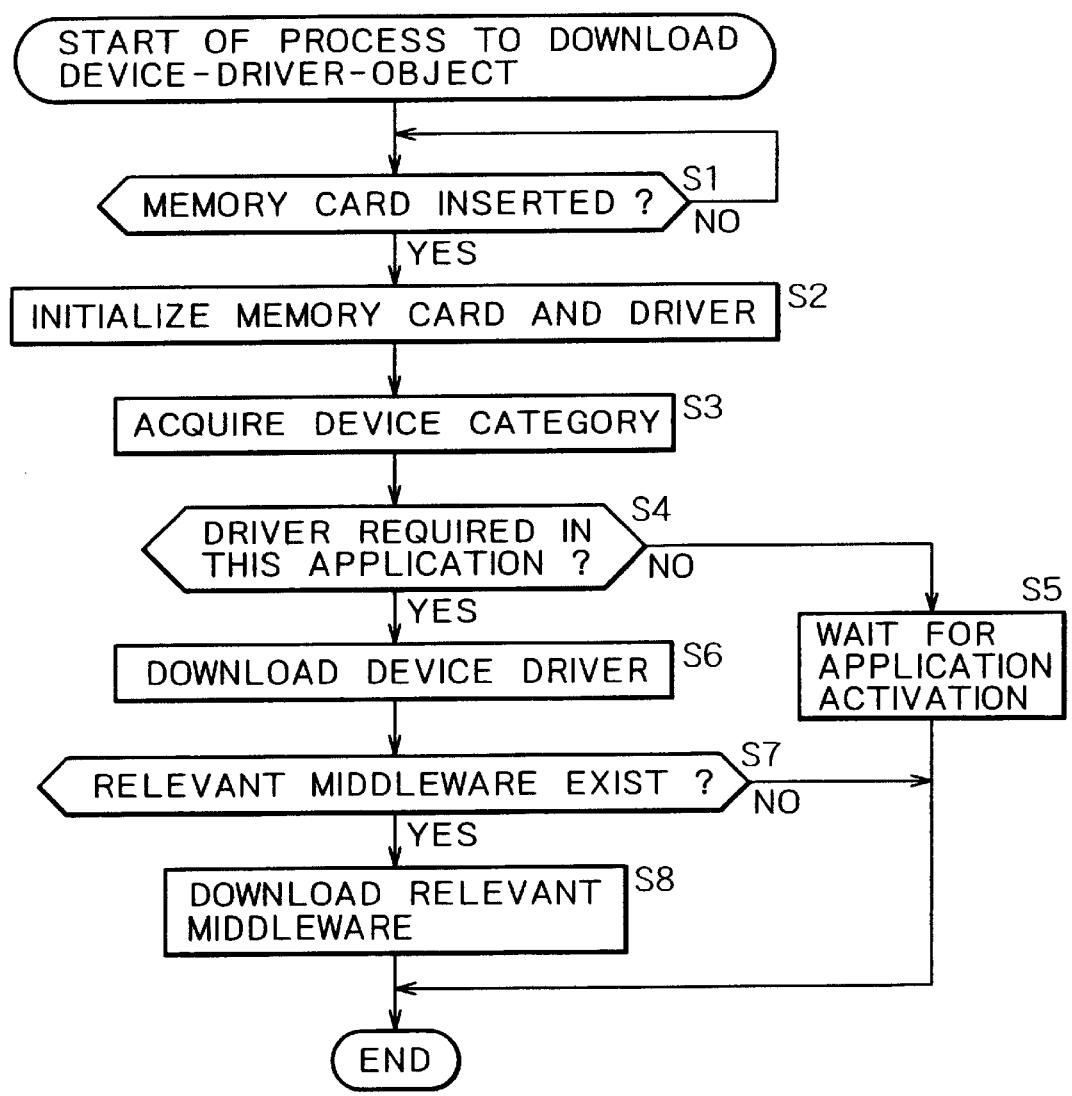
FIG. 10 is a flowchart representing a process to download a device-driver object.

The following description explains a process carried out by the personal computer 1 to download the object of a device driver by referring to a flowchart shown in FIG. 10.

As shown in the FIGURE, the flowchart begins with a step S1 at which the CPU 11 employed in the personal computer 1 forms a judgment as to whether or not the memory card 6, namely, the memory card 6-1 in this case, has been inserted into the personal computer 1. That is to say, the personal computer 1 is put in a state of waiting for the memory card 6 to be inserted. As the outcome of the judgment formed at the step S1 indicates that the memory card 6 has been inserted into the personal computer 1, the flow of the downloading process goes on to a step S2 at which the CPU 11 initializes the memory card 6 and an inserted device.

Then, at the next step S3, the CPU 11 acquires a device category stored in the ROM 123 employed in the memory card 6. The category of the device is the device-category ID shown in FIG. 9. Subsequently, the flow of the downloading process goes on to a step S4 to form a judgment as to whether or not a device driver identified by the device category acquired at the step S3 is required by an application program to be executed by the personal computer 1 serving as the main unit to drive the inserted device. If the outcome of the judgment indicates that a device driver identified by the device category is required by the application program to be executed by the personal computer 1 serving as the main unit, the flow of the downloading process goes on to a step S6.

At the step S6, the CPU 11 downloads the device driver identified by the device category acquired at the step S3. Then, the flow of the downloading process goes on to a step S7 to form a judgment as to whether or not there exists a middleware relevant to the object of the device driver downloaded at the step S6. If the outcome of the judgment indicates that a relevant middleware exists, the flow of the process goes on to a step S8.

At the step S8, the CPU 11 downloads the middleware relevant to the object of the device driver downloaded at the step S6.

If the outcome of the judgment formed at the step S7 indicates that a relevant middleware does not exist, on the other hand, the downloading process is ended.

If the outcome of the judgment formed at the step S4 indicates that a device driver identified by the device category is not required by the application program executed by the personal computer 1 serving as the main unit, on the other hand, the flow of the downloading process goes on to a step S5 at which the CPU 11 waits for activation of the application program before this downloading process is ended.

In accordance with the above description, the object of a device driver is downloaded if necessary when the memory card 6-1 is inserted into the personal computer 1. However, the present invention is not limited to insertion of the memory card 6 into a personal computer 1. For example, the object of a device driver is downloaded in the same way when the memory card is inserted into another apparatus such as the PDA 2, a DTV (digital television), an STB (Set Top Box) or a digital camcoder.

In addition, additional information on a middleware, namely, the relevant middleware object shown in FIG. 9, allows the middleware to be downloaded with ease.

While the memory card 6 has been exemplified by using a Memory Stick, the present invention can also be applied to memory cards other than the Memory Stick.

Figure 11:
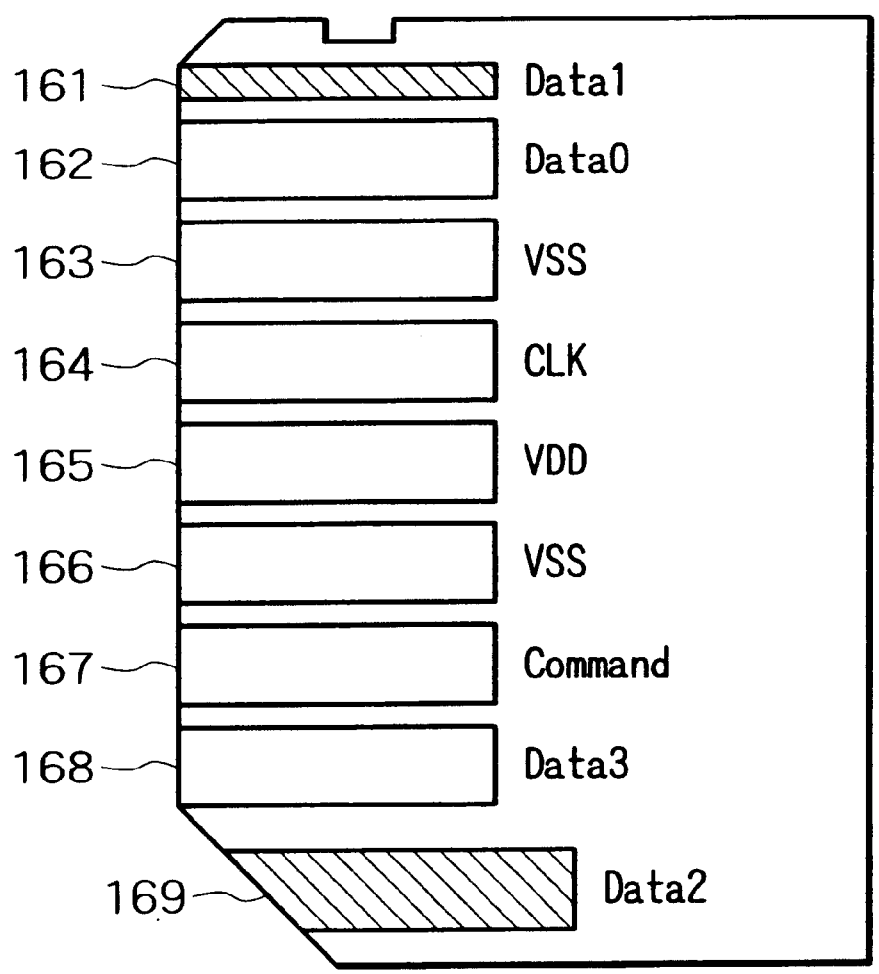
FIG. 11 is a diagram showing a typical layout of pins employed in a memory card implemented by a second embodiment of the present invention.

FIG. 11 is a diagram showing a typical layout of pins employed in the memory card 6 implemented by a second embodiment of the present invention.

The memory card 6 shown in the FIGURE is typically a semiconductor memory card called an SD card. This SD card is a small-size memory card having a height of 24 mm, a width of 32 mm and a thickness of 2.1 mm. The SD card has a protect switch for avoiding inadvertent erasure. The SD card has a large storage capacity, allows data stored therein to be updated at a high speed and the copyright to be protected with a high degree of reliability.

The memory card 6 shown in FIG. 11 has 9 pins, namely, pins 161 to 169. The Data0 pin 162 and the Data3 pin 168 are each a pin for exchanging data. The VSS pins 163 and

166 are connected to the ground. The pin 164 is a pin for receiving a clock signal. The VDD pin 165 is a pin for receiving the voltage of a power supply. The command pin 167 is a pin for receiving a command. The Data1 pin 161 and the Data2 pin 169 are assigned to a differential-data unit of an interface of a serial system conforming to typically the USB standards.

Figure 12:
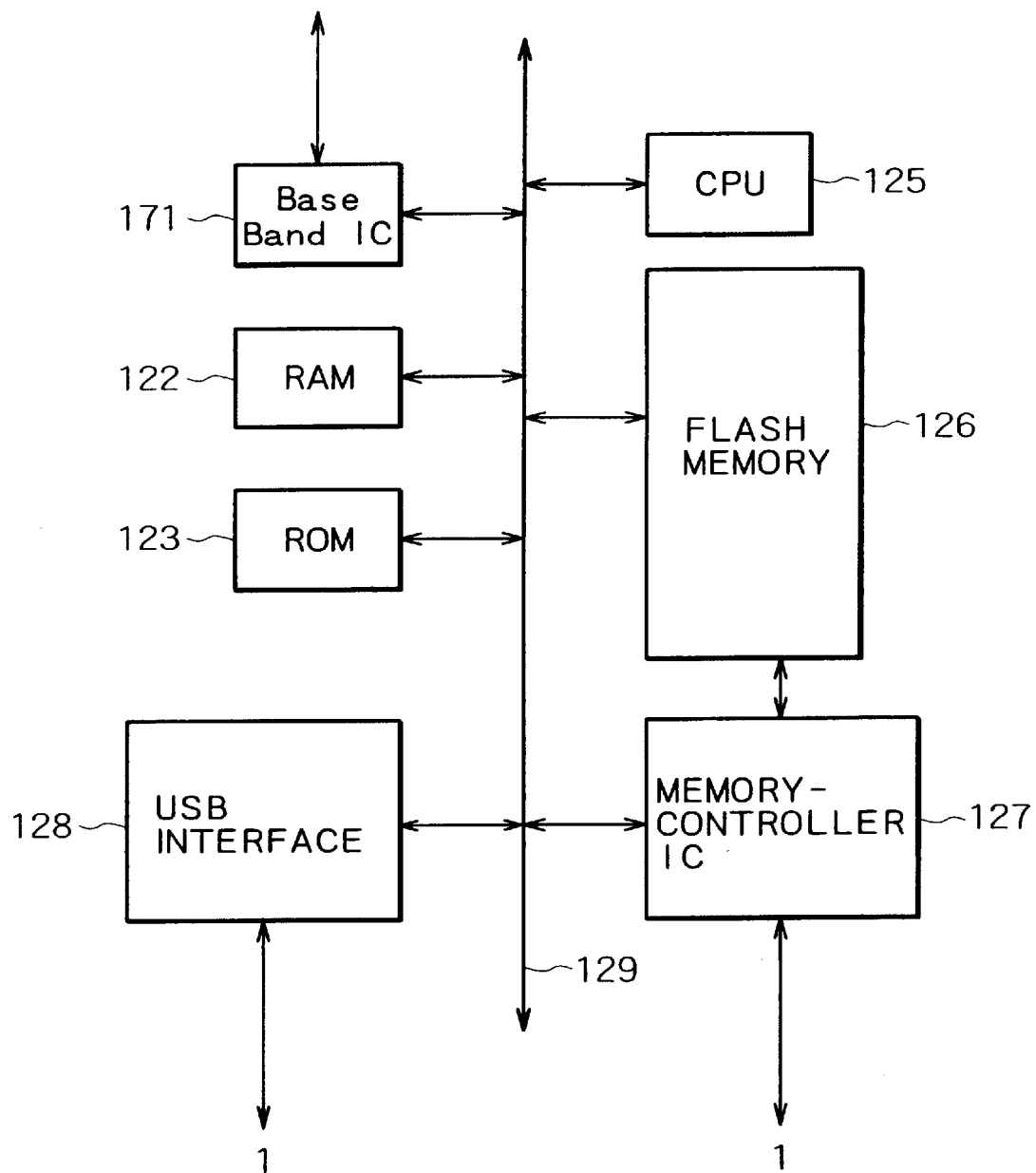
FIG. 12 is a diagram showing a typical hardware configuration of the memory card shown in FIG. 11.

FIG. 12 is a diagram showing a typical hardware configuration of the memory card 6 shown in FIG. 11. Components of the configuration shown in FIG. 12, which are identical with those shown in FIG. 5, are denoted by the same reference numerals as the latter, and their explanation is not repeated.

In the case of the configuration shown in FIG. 12, a base-band IC 171 is provided in place of the ASIC 121, and the MPEG-4 Codec processing unit 124 is eliminated.

The base-band IC 171 is connected to a communication unit conforming to a radio communication standards such as Bluetooth. The communication unit itself is not shown in the FIGURE. Audio data received from the communication unit is converted into Bluetooth-communication packets and, after being subjected to processing such as error correction and encoding, the packets are supplied to the personal computer 1 by way of the bus 129 and the memory-controller IC 127 or the USB interface unit 128.

Controlled by the CPU 125, the memory-controller IC 127 supplies the audio data supplied by the communication unit through the bus 129 to the personal computer 1, and passes on a command or the like received from the personal computer 1 to the communication unit by way of the bus 129.

By the same token, controlled by the CPU 125, the USB interface unit 128 supplies the audio data supplied by the communication unit through the bus 129 to the personal computer 1 conforming to the USB standards, and passes on a command or the like received from the personal computer 1 conforming to the USB standards to the communication unit by way of the bus 129.

Figure 13:
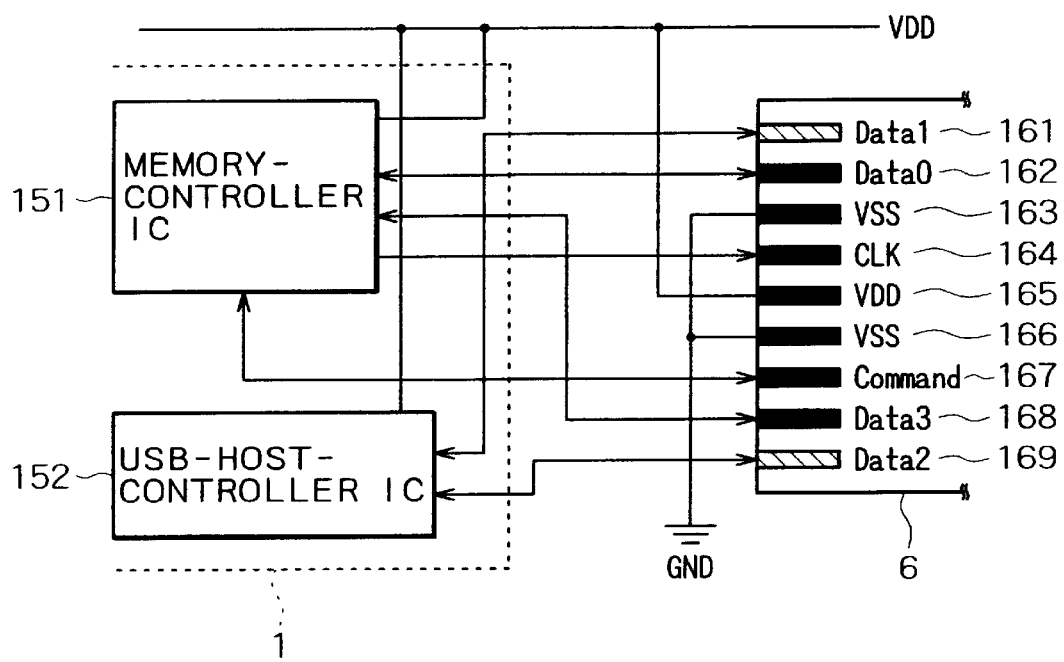
FIG. 13 is a diagram showing a typical internal configuration of the memory card shown in FIG. 11 with the memory card connected to the personal computer.

FIG. 13 is a diagram showing a typical internal configuration of the memory card 6 shown in FIG. 11 with the memory card 6 connected to the personal computer 1. Components of the configuration shown in FIG. 13, which are identical with those shown in FIG. 7, are denoted by the same reference numerals as the latter, and their explanation is not repeated.

As shown in the FIGURE, pins 162, 164, 167 and 168 of the memory card 6 are connected to a memory-controller IC 151 of the personal computer 1 and used for exchanging data. On the other hand, pins 161 and 169 of the memory card 6 are connected to a USB-host-controller IC 152 of the personal computer 1 and used for exchanging serial data conforming to the USB standards.

FIG. 14 is a diagram showing typical assignment of pins employed in the memory card 6 implemented by a third embodiment of the present invention. The embodiment shown in FIG. 14 implements assignment of pins of a PCMCIA card in a 16-bit and a 32-bit Cardbus mode.

In the case of the PCMCIA card in a 16-bit mode, the 44th, 45th and 60th pins are described as RFU-signal pins. They are reserved for a future card interface. These pins are assigned to a differential signal conforming to the USB standards.

In the case of the PCMCIA card in a 32-bit Cardbus mode, on the other hand, the 32nd, 40th and 47th pins are described as RFU-signal pins. These pins are assigned to a differential signal conforming to the USB standards.

Figure 15:
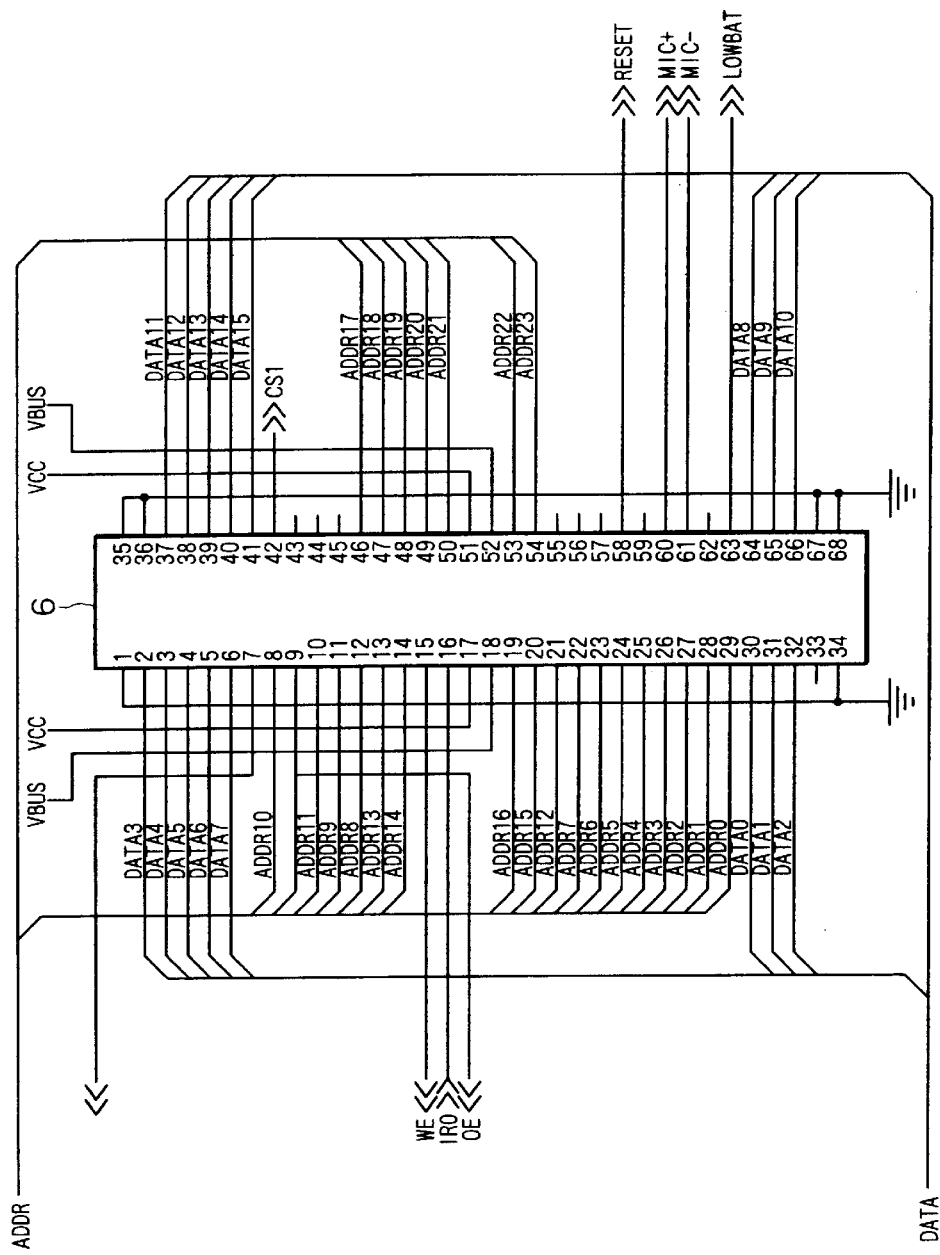
FIG. 15 is a diagram showing a typical layout of pins employed in the memory card implemented by a fourth embodiment of the present invention.

FIG. 15 is a diagram showing a typical layout of pins employed in the memory card 6 implemented by a fourth embodiment of the present invention.

In the layout shown in FIG. 15, the 33rd, the 43rd to the 45th, the 55th to the 57th, the 59th and the 62nd pins are available to be assigned to differential signals conforming to the USB standards.

As described above, in the case of either memory card, an available pin, if any, can be assigned to a differential signal conforming to the USB standards, making it easy to construct a memory card with an additional specific function.

As described above, a differential signal conforming to the USB standards is assigned to an available pin. However, the present invention is not limited to this scheme. For example, a differential signal conforming to IEEE (the Institute of Electrical and Electronics Engineers)-1394 specifications can also be assigned to an available pin.

In addition, an interface for inputting and outputting serial data conforming to the USB standards can be provided as a pin different from an interface for inputting and outputting native data. However, a pin shared by both signals can also be used as a module.

As described above, in accordance with the present invention, an available pin is assigned to a differential signal conforming to the USB standards to exhibit the following effects:

1: By utilizing the interface conforming to the existing USB standards, it is no longer necessary to newly create an IC such as a controller for controlling the interface. As a result, fast market penetration is possible.
2: From the device-side point of view, the interface is clearly defined. Thus, the basic design can be utilized as it is. As a result, the hardware can be designed with ease.
3: By using an interface conforming to predetermined specifications, problems such as an issue of incompatibility with the device can be examined relatively with ease.
4: By using an RTOS having a download function, device-driver software can be downloaded if necessary. Thus, it is no longer necessary for the user to install the device driver. As a result, improved operatability can be expected.

The sequence of processes described above can be carried out by hardware or through execution of software. If the sequence of processes described above is carried out through execution of software, programs composing the software are carried out by a processor incorporated in dedicated hardware serving as the portable device 6 or by typically a general-purpose personal computer capable of performing a variety of functions. Such a processor corresponds to the CPU 53. Such a personal computer has a variety of programs installed in recording media employed in the personal computer to be executed to perform the functions.

The recording media for recording the programs in a format executable by a computer is installed in the computer. As shown in FIG. 2, an example of the recording media is package media such as the magnetic disc 41 including a floppy disc, the optical disc 42 including a CD-ROM (Compact-Disc Read-Only Memory) and a DVD (Digital Versatile Disc), the magnetic-optical disc 43 including an MD (Mini Disc) or the semiconductor memory 44. As an alternative, a program can also be presented to the user by incorporating the program in the computer permanently. That is to say, the program is stored in the ROM 12, a hard disc included in the HDD 21 or the like. A program is stored in a program storage media if necessary through an interface such as the communication unit 25 by using wire or wireless communication media including the network 2 such as a local area network or the Internet and digital satellite broadcasting.

It should be noted that, in this specification, while steps prescribed in a program recorded in a recording medium can of course be executed sequentially along the time axis in an order the steps are prescribed in the program, the steps are not always executed sequentially along the time axis. That is to say, a program may include steps that are executed concurrently or independently.

In addition, the technical term 'system' used in this specification means the whole equipment comprising a plurality of apparatuses.

While a preferred embodiment of the present invention has been described using specific terms, such description is for illustrative purposes only, and it is to be understood that changes and variations may be made without departing from the spirit or scope of the following claims.

What is claimed is:

1. An information-processing apparatus exchanging first or second data with a memory card mounted on said information-processing apparatus, said apparatus comprising:

first communication means for exchanging said first data with a first pin employed in said memory card; and second communication means for exchanging said second data with a second pin employed in said memory cards, wherein said first communication means includes a memory-controller integrated circuit (IC), and said second communication means includes a universal serial bus (USB) interface unit, and wherein said first data is exchanged via said memory-controller IC and said second data conforms to USB standards and is exchanged via said USB interface unit.

2. An information-processing apparatus according to claim 1, wherein said second communication means is an IEEE 1394 interface.

3. An information-processing apparatus exchanging first or second data with a memory card mounted on said information-processing apparatus, said apparatus comprising:

first communication means for exchanging said first data with a first pin employed in said memory card; and second communication means for exchanging said second data with a second pin employed in said memory card, wherein said information-processing apparatus further comprises acquisition means for determining a device type of said memory card when said memory card is mounted on said information-processing apparatus and acquiring a device driver stored in said memory card on the basis of a result of determination of said device type.

4. An information-processing method adopted in an information-processing apparatus exchanging first or second data with a memory card mounted on said information-processing apparatus, said information-processing method comprising:

a first communication step of exchanging said first data with a first pin employed in said memory card; and a second communication step of exchanging said second data with a second pin employed in said memory card, wherein said first data is exchangeable via a memory-controller integrated circuit (IC) in said memory card and said second data conforms to USB standards and is exchangeable via a USB interface in said memory card.

5. A program storage medium for storing a computer-readable program executable by a computer for controlling an information-processing apparatus exchanging first or second data with a memory card mounted on said information-processing apparatus, said program comprising:

a first communication step of exchanging said first data with a first pin employed in said memory card; and a second communication step of exchanging said second data with a second pin employed in said memory card, wherein said first data is exchangeable via a memory-controller integrated circuit (IC) in said memory card and said second data conforms to USB standards and is exchangeable via a USB interface in said memory card.

6. A memory card connectable to an information-processing apparatus, said memory card comprising:

connection means connectable to said information-processing apparatus by a plurality of first and second pins;

first communication means for exchanging first data with said information-processing apparatus through said first pin employed in said connection means; and second communication means for exchanging second data with said information-processing apparatus through said second pin employed in said connection means, wherein said first communication means includes a memory-controller integrated circuit (IC), and said second communication means includes a universal serial bus (USB) interface unit, and wherein said first data is exchanged via said memory-controller integrated circuit (IC) and said second data conforms to USB standards and is exchanged via said USB interface unit.

7. A memory card according to claim 6, wherein said second communication means is an IEEE 1394 interface.

8. A memory card according to claim 6, wherein said memory card further comprises storage means for storing a device driver of said memory card.

9. A memory card according to claim 6, wherein said memory card also exchanges serial data with said information-processing apparatus through either one of said first and second pins.

* * * * *